United States Patent
Lee et al.

(10) Patent No.: US 11,108,213 B2
(45) Date of Patent: Aug. 31, 2021

(54) LIGHT MODULATION ELEMENT, OPTICAL DEVICE INCLUDING THE LIGHT MODULATION ELEMENT, AND ELECTRONIC DEVICE INCLUDING THE OPTICAL DEVICE

(71) Applicants: SAMSUNG ELECTRONICS CO., LTD., Suwon-si (KR); CALIFORNIA INSTITUTE OF TECHNOLOGY, Pasadena, CA (US)

(72) Inventors: Duhyun Lee, Yongin-si (KR); Muhammad Alam, Kingston (CA); Ghazaleh Kafaie Shirmanesh, Pasadena, CA (US); Harry Atwater, Pasadena, CA (US); Pin Chieh Wu, Pasadena, CA (US); Ragip Pala, Pleasanton, CA (US)

(73) Assignees: SAMSUNG ELECTRONICS CO., LTD., Suwon-si (KR); CALIFORNIA INSTITUTE OF TECHNOLOGY, Pasadena, CA (US)

( * ) Notice: Subject to any disclaimer, the term of this patent is extended or adjusted under 35 U.S.C. 154(b) by 5 days.

(21) Appl. No.: 16/804,442

(22) Filed: Feb. 28, 2020

(65) Prior Publication Data
US 2020/0280174 A1    Sep. 3, 2020

Related U.S. Application Data

(60) Provisional application No. 62/811,900, filed on Feb. 28, 2019.

(30) Foreign Application Priority Data

May 28, 2019 (KR) .......................... 10-2019-0062593

(51) Int. Cl.
*H01S 5/00* (2006.01)
*H01S 5/183* (2006.01)
(Continued)

(52) U.S. Cl.
CPC ........ *H01S 5/18302* (2013.01); *H01S 5/0218* (2013.01); *H01S 5/125* (2013.01);
(Continued)

(58) Field of Classification Search
CPC .... H01S 5/187; H01S 5/18327; H01S 5/2228; H01S 5/18302; H01S 5/125; H01S 5/18375; H01S 5/0218
See application file for complete search history.

(56) References Cited

U.S. PATENT DOCUMENTS 4,885,753 A * 12/1989 Okai .................... H01S 5/06256
                                                       372/45.01
5,299,045 A *  3/1994 Sekiguchi .......... G02B 6/12007
                                                          385/10
(Continued)

FOREIGN PATENT DOCUMENTS

| JP | H10-65277 A | 3/1998 |
| KR | 10-1638973 B1 | 7/2016 |
| KR | 10-2018-0121375 A | 11/2018 |

OTHER PUBLICATIONS

Yao-Wei Huang et al. "Gate-Tunable Conducting Oxide Metasurfaces" Nano Letters, American Chemical Society, vol. 16, 2016, (pp. 5319-5325).
(Continued)

*Primary Examiner* — Kinam Park
(74) *Attorney, Agent, or Firm* — Sughrue Mion, PLLC

(57) ABSTRACT

A light modulation element according to example embodiments includes a substrate; a first lower DBR layer on the substrate including a first material layer alternately stacked
(Continued)

with a second material layer having a different refractive index from the first material layer; a second lower DBR layer on the first lower DBR layer with a surface area less than the first lower DBR layer and including a third material layer alternately stacked with a fourth material layer having a different refractive index from the third material layer; an active layer on the second lower DBR layer, including a semiconductor material having a multi-quantum well structure and having a refractive index that varies according to an applied voltage; and an upper DBR layer on the active layer including a fifth material layer alternately stacked with a sixth material layer having a different refractive index from the fifth material layer.

20 Claims, 20 Drawing Sheets

(51) Int. Cl.
*H01S 5/125* (2006.01)
*H01S 5/02* (2006.01)
*H01S 5/187* (2006.01)
*H01S 5/22* (2006.01)

(52) U.S. Cl.
CPC .......... *H01S 5/18375* (2013.01); *H01S 5/187* (2013.01); *H01S 5/18327* (2013.01); *H01S 5/2228* (2013.01)

(56) References Cited

U.S. PATENT DOCUMENTS

| | | | | |
|---|---|---|---|---|
| 5,963,568 | A * | 10/1999 | Paoli | H01S 5/423 |
| | | | | 372/23 |
| 8,492,863 | B2 * | 7/2013 | Cho | B82Y 20/00 |
| | | | | 257/431 |
| 10,615,561 | B2 | 4/2020 | Joo et al. | |
| 2011/0181936 | A1 * | 7/2011 | Cho | G02F 1/218 |
| | | | | 359/260 |
| 2012/0162380 | A1 * | 6/2012 | Cho | B82Y 20/00 |
| | | | | 348/47 |
| 2018/0196138 | A1 | 7/2018 | Lee | |
| 2018/0301870 | A1 | 10/2018 | Chang-Hasnain et al. | |

OTHER PUBLICATIONS

Jeremiah P. Turpin et al. "Reconfigurable and Tunable Metamaterials: A Review of the Theory and Applications" International Journal of Antennas and Propagation, May 22, 2014, pp. 1-18 (19 total pages) http://dx.doi.org/10.1155/2014/429837.

* cited by examiner

LIGHT MODULATION ELEMENT, OPTICAL DEVICE INCLUDING THE LIGHT MODULATION ELEMENT, AND ELECTRONIC DEVICE INCLUDING THE OPTICAL DEVICE

CROSS-REFERENCE TO RELATED APPLICATIONS

This application claims the benefit of U.S. Provisional Application No. 62/811,900, filed on Feb. 28, 2019, in the U.S. Patent and Trademark Office, and Korean Patent Application No. 10-2019-0062593, filed on May 28, 2019, in the Korean Intellectual Property Office, the disclosures of which are incorporated by reference herein in their entireties.

BACKGROUND

1. Field

The disclosure relates to light modulation elements, optical devices including the light modulation elements, and electrical devices including the optical devices.

2. Description of Related Art

Light modulation elements that change the transmission/reflection, polarization, phase, intensity, path, etc. of incident light are utilized in various optical devices. Also, light modulation elements of various structures are employed in optical devices to control the properties of light in a desired manner.

As an example, a liquid crystal having optical anisotropy and a microelectromechanical system (MEMS) structure utilizing micro-mechanical movement of a light blocking/reflecting element are widely used in general light modulation elements. These light modulation elements have an operation response time of a few microseconds due to the characteristics of a driving method that is employed.

Recently, there has been an attempt to apply a meta-surface to a light modulation element. The meta-surface has a structure in which a thickness, a pattern, a period, etc. of the structure is smaller than a wavelength of incident light. For example, an optical device using a tunable meta surface based on a semiconductor material having variable optical properties (e.g., refractive index) and having multi-quantum well structures is used in a variety of technical fields from optical communication to optical sensing. For example, a light modulation element using a tunable meta-surface may include a Fabry-Perot resonator structure formed by a pair of distributed Bragg reflectors (hereinafter referred to as DBRs) or a sandwich structure in which a semiconductor material is provided between one DBR and a metal mirror.

SUMMARY

Provided are light modulating elements having improved reflectivity and including a DBR and a semiconductor material.

Provided are optical devices including an optical modulator having improved reflectivity.

Provided are electronic devices including an optical device including a light modulation element having improved reflectivity.

Additional aspects will be set forth in part in the description which follows and, in part, will be apparent from the description, or may be learned by practice of the presented example embodiments of the disclosure.

In accordance with an aspect of an example embodiment, a light modulation element includes a substrate; a first lower distributed Bragg reflector (DBR) layer provided on the substrate, the first lower DBR layer including at least one first material layer alternately stacked with at least one second material layer, wherein a first refractive index of the at least one first material layer is different from a second refractive index of the at least one second material layer; a second lower DBR layer provided on the first lower DBR layer, the second lower DBR layer including at least one third material layer alternately stacked with at least one fourth material layer, wherein a third refractive index of the at least one third material layer is different from a fourth refractive index of the at least one fourth material layer, the second lower DBR layer having a surface area less than a surface area of the first lower DBR layer; an active layer provided on the second lower DBR layer, the active layer including a semiconductor material having a multi-quantum well structure and having a refractive index that is variable according to an applied voltage; and an upper DBR layer provided on the active layer, the upper DBR layer including at least one fifth material layer alternately stacked with at least one sixth material layer, wherein a fifth refractive index of the at least one fifth material layer is different from a sixth refractive index of the at least one sixth material layer.

A range of a variance of the refractive index of the active layer may be set such that a reflectivity of the light modulation element with respect to an incident light thereon is maintained at 60% or more.

An optical thickness of a material layer from among the at least one first material layer and the at least one second material layer may be equal to an optical thickness of a material layer from among the at least one third material layer and the at least one fourth material layer.

The second refractive index of the at least one second material layer may be less than the first refractive index of the at least one first material layer, the fourth refractive index of the at least one fourth material layer may be less than the third refractive index of the at least one third material layer, the at least one first material layer and the at least one third material layer may include a same first material, and the at least one second material layer and the at least one fourth material layer may include a same second material.

The active layer may include a pair of $GaAs_xP_{1-x}$ ($0<x<1$) lead barrier layers.

The light modulation element may further include at least one GaAs sub-barrier layer alternately stacked with at least one $In_yGa_{1-y}As$ ($0<y<1$) well layer between the pair of $GaAs_xP_{1-x}$ lead barrier layers.

The light modulation element may further include a first electrode contacting the second lower DBR layer; and a second electrode contacting the upper DBR layer.

In accordance with an aspect of an example embodiment, a light modulation element includes a substrate comprising a metal; a lower DBR layer provided on the substrate, the lower DBR layer including at least one first material layer alternately stacked with at least one second material layer, wherein a first refractive index of the at least one first material layer is different from a second refractive index of the at least one second material layer; an active layer provided on the lower DBR layer, the active layer including a semiconductor material having a multi-quantum well structure and having a refractive index that is variable according to an applied voltage; and an upper DBR layer provided on the active layer, the upper DBR layer including at least one third material layer alternately stacked with at least one fourth material layer, wherein a third refractive index of the at least one third material layer is different from a fourth refractive index of the at least one fourth material layer.

The metal may include at least one from among Au, Al, and Ag.

A range of a variance of the refractive index of the active layer may be set such that a reflectivity of the light modulation element with respect to an incident light thereon is maintained at 60% or more.

In accordance with an aspect of an example embodiment, an optical device includes a substrate; a first lower DBR layer provided on the substrate, the first lower DBR layer including at least one first material layer alternately stacked with at least one second material layer, wherein a first refractive index of the at least one first material layer is different from a second refractive index of the at least one second material layer; a plurality of resonators spaced apart from each other and provided on the first lower DBR layer, each resonator from among the plurality of resonators having a refractive index that is variable according to an applied voltage; and a voltage controller configured to control the voltage applied to each resonator from among the plurality of resonators, wherein each resonator from among the plurality of resonators includes a second lower DBR layer provided on the first lower DBR layer, the second lower DBR layer including at least one third material layer alternately stacked with at least one fourth material layer, wherein a third refractive index of the at least one third material layer is different from a fourth refractive index of the at least one fourth material layer, the second lower DBR layer having a surface area less than a surface area of the first lower DBR layer; an active layer provided on the second lower DBR layer, the active layer including a semiconductor material having a multi-quantum well structure and having a refractive index that is variable according to the applied voltage; and an upper DBR layer provided on the active layer, the upper DBR layer including at least one fifth material layer alternately stacked with at least one sixth material layer, wherein a fifth refractive index of the at least one fifth material layer is different from a sixth refractive index of the at least one sixth material layer.

A range of a variance of the refractive index of the active layer may be set such that a reflectivity of the optical device with respect to an incident light thereon is maintained at 60% or more.

An optical thickness of a material layer from among the at least one first material layer and the at least one second material layer may be equal to an optical thickness of a material layer from among the at least one third material layer and the at least one fourth material layer.

The second refractive index of the at least one second material layer may be less than the first refractive index of the at least one first material layer, the fourth refractive index of the at least one fourth material layer may be less than the third refractive index of the at least one third material layer, the at least one first material layer and the at least one third material layer may include a same first material, and the at least one second material layer and the at least one fourth material layer may include a same second material.

The active layer may include a pair of $GaAs_xP_{1-x}$ ($0<x<1$) lead barrier layers.

The optical device may further include at least one GaAs sub-barrier layer alternately stacked with at least one $In_yGa_{1-y}As$ ($0<y<1$) well layer between the pair of $GaAs_xP_{1-x}$ lead barrier layers.

In accordance with an aspect of an example embodiment, an optical device includes a substrate comprising a metal; a plurality of resonators spaced apart from each other and provided on the substrate, each resonator from among the plurality of resonators having a refractive index that is variable according to an applied voltage; and a voltage controller configured to control the voltage applied to each resonator from among the plurality of resonators, wherein each resonator from among the plurality of resonators includes a lower DBR layer provided on the substrate, the lower DBR layer including at least one first material layer alternately stacked with at least one second material layer, wherein a first refractive index of the at least one first material layer is different from a second refractive index of the at least one second material layer; an active layer provided on the lower DBR layer, the active layer including a semiconductor material having a multi-quantum well structure and having a refractive index that is variable according to the applied voltage; and an upper DBR layer provided on the active layer, the upper DBR layer including at least one third material layer alternately stacked with at least one fourth material layer, wherein a third refractive index of the at least one third material layer is different from a fourth refractive index of the at least one fourth material layer.

An electronic device may include a light source; the optical device in accordance with a previously described aspect of the disclosure, wherein the optical device controls a direction of light received from the light source to be transmitted towards an object; a sensor configured to receive light reflected from the object; and a processor configured to analyze the light received by the sensor.

An optical thickness of a material layer from among the at least one first material layer and the at least one second material layer may be equal to an optical thickness of a material layer from among the at least one third material layer and the at least one fourth material layer.

The second refractive index of the at least one second material layer may be less than the first refractive index of the at least one first material layer, the fourth refractive index of the at least one fourth material layer may be less than the third refractive index of the at least one third material layer, the at least one first material layer and the at least one third material layer may include a same first material, and the at least one second material layer and the at least one fourth material layer may include a same second material.

BRIEF DESCRIPTION OF THE DRAWINGS

The above and/or other aspects, features, and advantages of certain example embodiments will be more apparent from the following description taken in conjunction with the accompanying drawings, in which.

DETAILED DESCRIPTION

Figure 1:
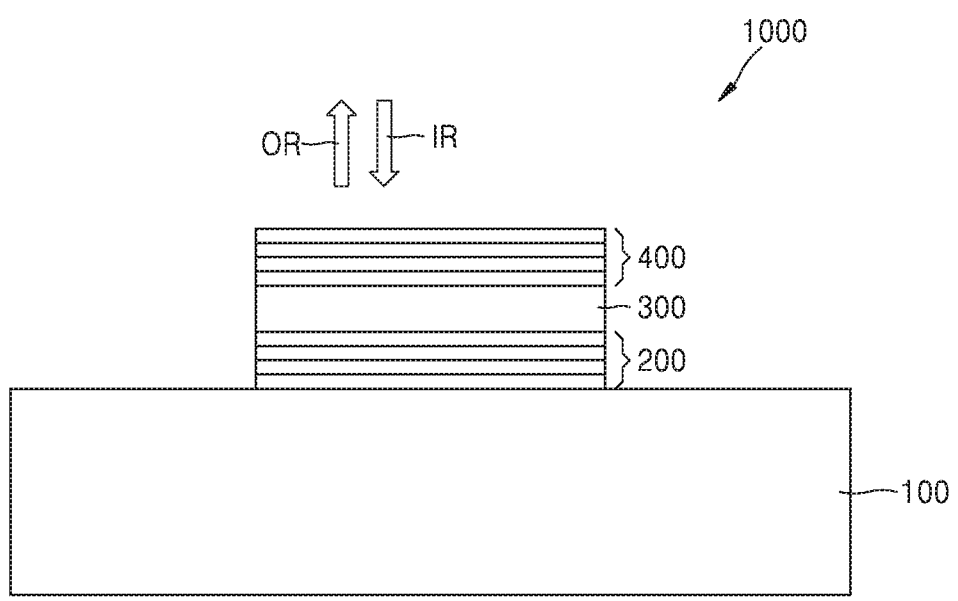
FIG. 1 is a lateral cross-sectional view showing a light modulation element according to an example embodiment.

Hereinafter, a light modulation element, an optical device including the light modulation element and an electrical device including the optical device according to various example embodiments will be described in detail with reference to the accompanying drawings. In the drawings, like reference numerals refer to like elements, and the size and thickness of each constituent element may be exaggerated for clarity of explanation.

The terms first, second, etc. may be used to describe various elements, but the elements should not be limited by the terms. Terms are used only for the purpose of distinguishing one component from another. The light modulation element, optical device including the light modulation element and electrical device including the optical device may be realized in various different forms and are not limited to the example embodiments described herein.

Also, in the specification, the terms "units" and "modules" denote units or modules that process at least one function or operation, and may be realized by hardware, software, or a combination of hardware and software.

It will be understood that when an element or layer is referred to as being "on" or "above" another element or layer, the element or layer may be directly on another element or layer or there may be intervening elements or layers. Hereafter, reference will now be made in detail to example embodiments of the present disclosure, examples of which are illustrated in the accompanying drawings.

It should be understood that, when a part "comprises" or "includes" an element in the specification, unless otherwise defined, other elements are not excluded from the part and the part may further include other elements.

Figure 2:
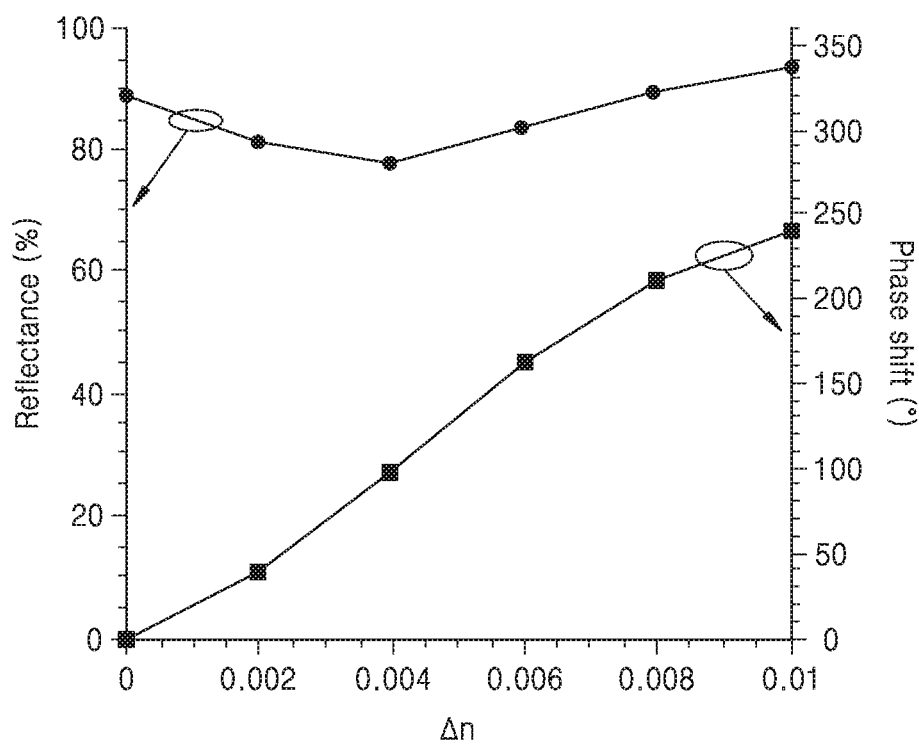
FIG. 2 is a graph showing changes in the reflectivity of a light modulation element and the phase shift of incident light according to a refractive index change of an active layer of FIG. 1.
Figure 3:
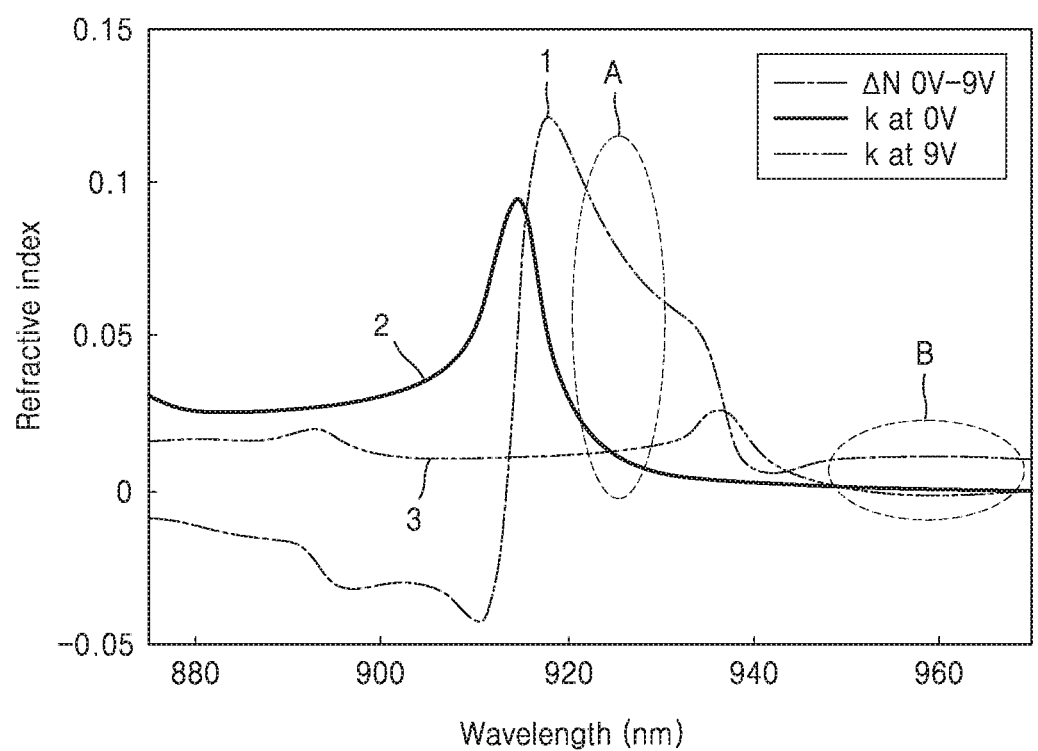
FIG. 3 is a graph showing a relationship between a wavelength and a refractive index of incident light on the light modulation element of FIG. 1.

FIG. 1 is a lateral cross-sectional view showing a light modulation element 1000 according to an example embodiment. FIG. 2 is a graph showing changes in the reflectivity of the light modulation element 1000 and the phase shift of incident light according to a refractive index change of an active layer 300 of FIG. 1. FIG. 3 is a graph showing a relationship between a wavelength and a refractive index of incident light IR on the light modulation element 1000 of FIG. 1.

Referring to FIG. 1, the light modulation element 1000 may include a substrate 100, a lower distributed Bragg reflector (DBR) layer 200 provided on the substrate 100, formed by repeatedly alternately stacking two material layers having refractive indexes different from each other; an active layer 300 that is arranged on the lower DBR layer 200, includes a semiconductor material having a multi-quantum well structure, and has a refractive index variable according to an applied voltage; and an upper DBR layer 400 provided on the active layer 300, formed by repeatedly alternately stacking two material layers having refractive indexes different from each other. In other words, the lower DBR layer 200 may include at least one first material layer alternately stacked with at least one second material layer, wherein a refractive index of the at least one first material layer is different from a refractive index of the at least one second material layer. The upper DBR layer 400 may include at least one third material layer alternately stacked with at least one fourth material layer, wherein a refractive index of the at least one third material layer is different from a refractive index of the at least one fourth material layer. Furthermore, the light modulation element 1000 may further include a first electrode that contacts the lower DBR layer 200 and a second electrode that contacts the upper DBR layer 400.

The lower DBR layer 200 and the upper DBR layer 400 form a Fabry-Perot resonator. The incident light IR from the outside of the upper DBR layer 400 may resonate between the lower DBR layer 200 and the upper DBR layer 400. At this time, the reflectivity of the upper DBR layer 400 may be less than that of the lower DBR layer 200. Accordingly, light resonating between the lower DBR layer 200 and the upper DBR layer 400 may be outputted to the outside through the upper DBR layer 400.

When a predetermined voltage is applied between the first electrode and the second electrode from an external power source, the refractive index of the active layer 300 arranged between the lower DBR layer 200 and the upper DBR layer 400 may be changed. Thus, a phase of the light resonating between the lower DBR layer 200 and the upper DBR layer 400 is changed. Accordingly, the phases of the incident light IR and output light OR may be different from each other.

Furthermore, when a predetermined voltage is applied between the first electrode and the second electrode from the external power source, a part of the light resonated between the lower DBR layer 200 and the upper DBR layer 400 is absorbed in the active layer 300 by electro-absorption. Accordingly, the intensities of the incident light IR and the output light OR may be different from each other.

The substrate 100 may be provided under the Fabry-Perot resonator formed by the lower DBR layer 200 and the upper DBR layer 400. A surface area of the substrate 100 may be greater than that of the Fabry-Perot resonator. For example, the surface area of the substrate 100 may be greater than surface areas of the lower DBR layer 200, the active layer 300, and the upper DBR layer 400. The substrate 100 may include a metal. For example, the metal included in the substrate 100 may include any one of gold (Au), aluminum (Al), and silver (Ag), but is not limited thereto. The substrate 100 including a metal may serve as a reflective layer for reflecting light transmitted through the Fabry-Perot resonator. Accordingly, the reflectivity of the light modulation element 1000 with respect to the incident light IR may be increased as compared with the case where the substrate 100 does not include a metal. For example, while the refractive index of the active layer 300 is changed, the reflectivity of the light modulation element 1000 with respect to incident light IR may be maintained at 60% or more. In other words, the reflectivity of the light modulation element 1000 may be maintained at 60% or more throughout the range of refractive indexes of the active layer 300.

The lower and upper DBR layers 200 and 400 may serve as reflective layers having a predetermined reflectivity and may include a pair of material layers having different refractive indexes. For example, the lower DBR layer 200 and the upper DBR layer 400 may include structures in which a material layer having a relatively low refractive index and a material layer having a relatively high refractive index are repeatedly alternately stacked (i.e., the relatively low refractive index layer is alternately stacked with the relatively high refractive index layer). For example, the lower and upper DBR layers 200 and 400 may include an AlAs/Al$_{0.5}$Ga$_{0.5}$As structure or an Al$_{0.9}$Ga$_{0.1}$As/Al$_{0.3}$Ga$_{0.7}$As structure that is repeatedly alternately stacked. However, the present example embodiment is not limited thereto, and the ratio of Al to Ga may vary. Also, the material layers of the lower and upper DBR layers 200 and 400 may include materials entirely different from the example materials described above. When light of a specific wavelength is incident on the lower DBR layer 200 or the upper DBR layer 400, reflection occurs at an interface between two of the material layers. In this case, a high reflectivity may be obtained by causing all reflected light to have the same phase difference to cause constructive interference of the reflected light. For this purpose, an optical thickness (a value obtained by multiplying a physical thickness by a refractive index of the material layer) of each of the two material layers of both the lower and upper DBR layers 200 and 400 may be an odd multiple of $\lambda/4$ ($\lambda$ is a wavelength of incident light). The reflectivity of the lower and upper DBR layers 200 and 400 increases with an increase in the number of pairs of the two material layers that are present. The lower DBR layer 200 may have a reflectance higher than that of the upper DBR layer 400. Accordingly, light resonating between the lower DBR layer 200 and the upper DBR layer 400 may be outputted to the outside through the upper DBR layer 400.

An overall optical thickness of the active layer 300 may be configured to be equal to an integral multiple of a wavelength of incident light. Then, only incident light having a specific wavelength may be absorbed into the active layer 300 while resonating between the lower and upper DBR layers 200 and 400. The practical structure of the active layer 300 will be described below with reference to FIGS. 4 and 5.

Referring to FIG. 2, as the refractive index of the active layer 300 increases by application of an external voltage, the phase shift of incident light IR also increases. The change in the refractive index of the active layer 300 is represented in FIG. 2 as $\Delta n$. However, even when the refractive index of the active layer 300 changes, a change in the reflectivity of the light modulation element 1000 with respect to the incident light IR is relatively small. For example, while the refractive index varies in a range of 0 to 0.01 as shown in FIG. 2, the reflectivity is in a range from a minimum at about 70% to a maximum at about 99%. In this way, as the refractive index of the active layer 300 increases, the light modulation element 1000 may continue to have a relatively high reflectivity with little variation while also having a variable phase shift showing a relatively rapid change and may thereby perform efficient optical modulation.

Referring to FIG. 3, a first curve 1 indicates a difference between a real part of the refractive index of the active layer 300 before a voltage is applied (the applied voltage is 0 V) and when a voltage of 9 V is applied to the active layer 300 according to the wavelength of the incident light. A second curve 2 indicates a an imaginary part of the refractive index of the active layer 300 before a voltage is applied according to the wavelength of the incident light. A third curve 3 indicates the imaginary part of the refractive index of the active layer 300 when a voltage of 9 V is applied according to the wavelength of the incident light. A large imaginary part of the refractive index may denote that the loss of incident light is large. It is advantageous for the efficiency of light modulation to cause light modulation in an area where the change of the real part of the refractive index (corresponding to first curve 1) is large while the loss of incident light is small (corresponding to second and third curves 2 and 3). For example, the formation of a light modulation element with respect to incident light having a wavelength corresponding to a first region A and a second region B may be advantageous in light modulation.

Figure 4:
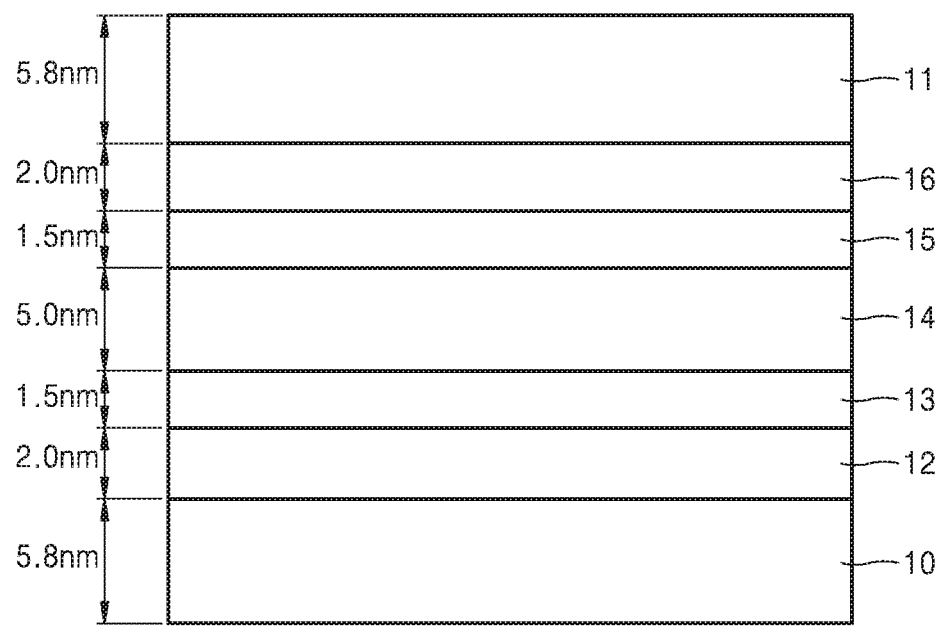
FIG. 4 is a lateral cross-sectional view showing a structure of the active layer of FIG. 1.
Figure 5:
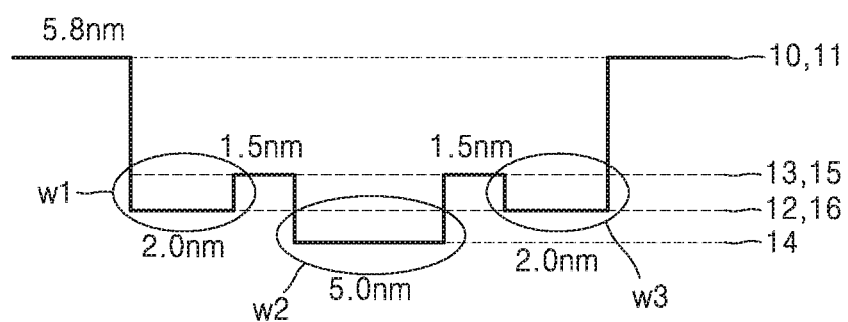
FIG. 5 is a diagram showing an energy level of each section of the active layer of FIG. 1.

FIG. 4 is a lateral cross-sectional view showing a structure of the active layer 300 of FIG. 1. FIG. 5 is a diagram showing a relative energy level of each section of the active layer 300 of FIG. 1.

The active layer 300 may include a pair of lead barrier layers 10 and 11. For example, the pair of lead barrier layers 10 and 11 may include a lower lead barrier layer 10 and an upper lead barrier layer 11. The lower lead barrier layer 10 and the upper lead barrier layer 11 respectively may include GaAs$_x$P$_{1-x}$(0<x<1). For example, the lower lead barrier layer 10 and the upper lead barrier layer 11 respectively may include GaAs$_{0.6}$P$_{0.4}$. However, the present example embodiment is not limited thereto, and the lower and upper lead barrier layers 10 and 11 may include a material other than GaAs$_x$P$_{1-x}$. The thickness of the lower lead barrier layer 10 and the upper lead barrier layer 11 respectively may be 5.8 nm, but is not limited thereto.

First and second GaAs sub-barrier layers 13 and 15 and first, second, and third In$_y$Ga$_{1-y}$As (0<y<1) well layers 12, 14, and 16 may be repeatedly alternately stacked between the lower and upper lead barrier layers 10 and 11. For example, a structure in which the first well layer 12 including In$_y$Ga$_{1-y}$As (0<y<1), the first sub-barrier layer 13 including GaAs, the second well layer 14 including In$_z$Ga$_{1-z}$As (0<z<1), the second sub-barrier layer 15 including GaAs, and a third well layer 16 including In$_y$Ga$_{1-y}$As (0<y<1) are sequentially stacked may be provided between the lower lead barrier layer 10 and the upper lead barrier layer 11. In FIG. 4, the first and second sub-barrier layers 13 and 15 and the first through third well layers 12, 14 and 16 are shown, but the present example embodiment is not limited thereto. The number of sub-barrier layers may be two or more and the number of well layers may be three or more. Also, without a sub-barrier layer, only the well layers may be provided between the lower lead barrier layer 10 and the upper lead barrier layer 11. Meanwhile, the first and second sub-barrier layers 13 and 15 may include materials other than GaAs, and the first through third well layers 12, 14, and 16 may include materials other than $In_yGa_{1-y}As$.

The first well layer 12 including $In_yGa_{1-y}As$ (0<y<1) may be provided on the lower lead barrier layer 10. For example, a y value may be 0.1. However, the present example embodiment is not limited thereto, and a ratio of In and Ga may vary. The first well layer 12 may have a thickness less than that of the lower lead barrier layer 10. For example, the thickness of the first well layer 12 may be 2.0 nm. However, the present example embodiment is not limited thereto, and the thickness of the first well layer 12 may be greater than or equal to the thickness of the lower lead barrier layer 10.

The first sub-barrier layer 13 including GaAs may be provided on the first well layer 12. The first sub-barrier layer 13 may have a thickness less than that of the first well layer 12. For example, the thickness of the first sub-barrier layer 13 may be 1.5 nm. However, the present example embodiment is not limited thereto, and the thickness of the first sub-barrier layer 13 may be greater than or equal to that of the first well layer 12.

The second well layer 14 including $In_zGa_{1-z}As$ (0<z<1) may be provided on the first sub-barrier layer 13. A z value corresponding to the second well layer 14 may be different from the y value corresponding to the first well layer 12. For example, the z value may be 0.15. However, the present example embodiment is not limited thereto, and a ratio of In and Ga may vary. For example, the z value and the y value may be the same. The thickness of the second well layer 14 may be greater than that of the first well layer 12. For example, the thickness of the second well layer 14 may be 5 nm. However, the present example embodiment is not limited thereto, and the thickness of the second well layer 14 may be less than or equal to that of the first well layer 12.

The second sub-barrier layer 15 including GaAs may be provided on the second well layer 14. The thickness of the second sub-barrier layer 15 may be equal to that of the first sub-barrier layer 13. For example, the thickness of the second sub-barrier layer 15 may be 1.5 nm. However, the present example embodiment is not limited thereto, and the thickness of the second sub-barrier layer 15 may be different from that of the first sub-barrier layer 13.

The third well layer 16 including $In_yGa_{1-y}As$ (0<y<1) may further be provided on the second sub-barrier layer 15. For example, the y value may be 0.1. However, the present example embodiment is not limited thereto, and a ratio of In and Ga may vary. The thickness of the third well layer 16 may be equal to that of the first well layer 12. For example, the thickness of the third well layer 16 may be 2.0 nm. However, the present example embodiment is not limited thereto, and the thickness of the third well layer 16 may be different from that of the first well layer 12.

Referring to FIG. 5, a plurality of quantum well structures w1, w2, and w3 may be formed according to the structure in which the lower lead barrier layer 10, the first well layer 12, the first sub-barrier layer 13, the second well layer 14, the second sub-barrier layer 15, the third well layer 16, and the upper lead barrier layer 11 each having a unique energy level are sequentially stacked in the stated order.

For example, the energy level of the first well layer 12 having a thickness of 2.0 nm may be less than the energy levels of the adjacent first lower lead barrier layer 10 having a thickness of 5.8 nm and the first sub-barrier layer 13 having a thickness of 1.5 nm, and a first quantum well structure w1 as shown in FIG. 5 may be formed by the difference of the energy levels. Also, the energy level of the second well layer 14 having a thickness of 5.0 nm may be less than the energy levels of the adjacent first sub-barrier layer 13 having a thickness of 1.5 nm and the second sub-barrier layer 15 having a thickness of 1.5 nm, and a second quantum well structure w2 may be formed by the difference of the energy levels. Furthermore, the energy level of the third well layer 16 having a thickness of 2.0 nm may be less than the energy levels of the adjacent second sub-barrier layer 15 having a thickness of 1.5 nm and the upper lead barrier layer 11 having a thickness of 5.8 nm, and a third quantum well structure w3 may be formed by the difference of the energy levels. In FIG. 5, although three quantum well structures are depicted, the number of quantum well structures may be less or greater than three.

Figure 6:
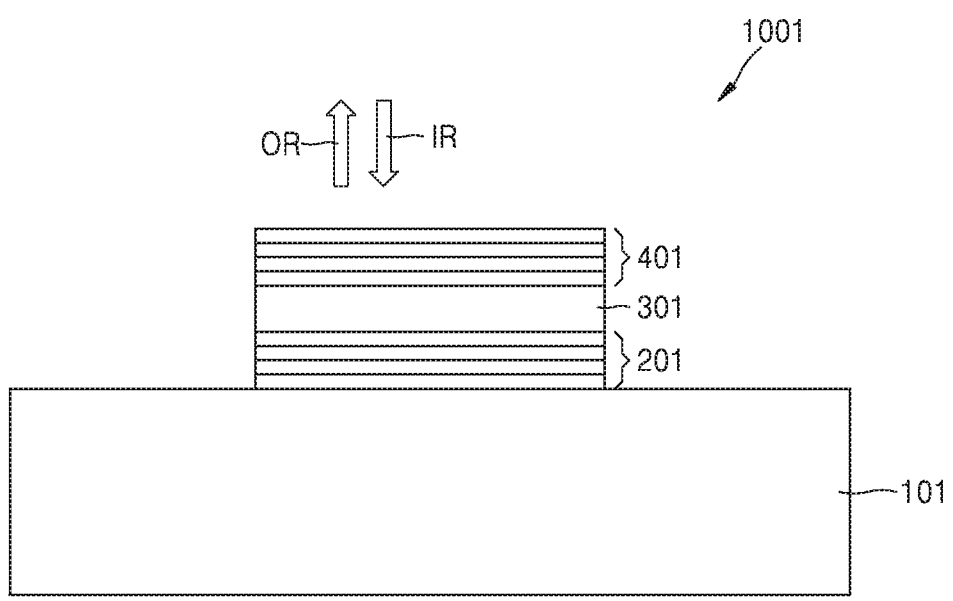
FIG. 6 is a lateral cross-sectional view showing a light modulation element according to a comparative example.
Figure 7:
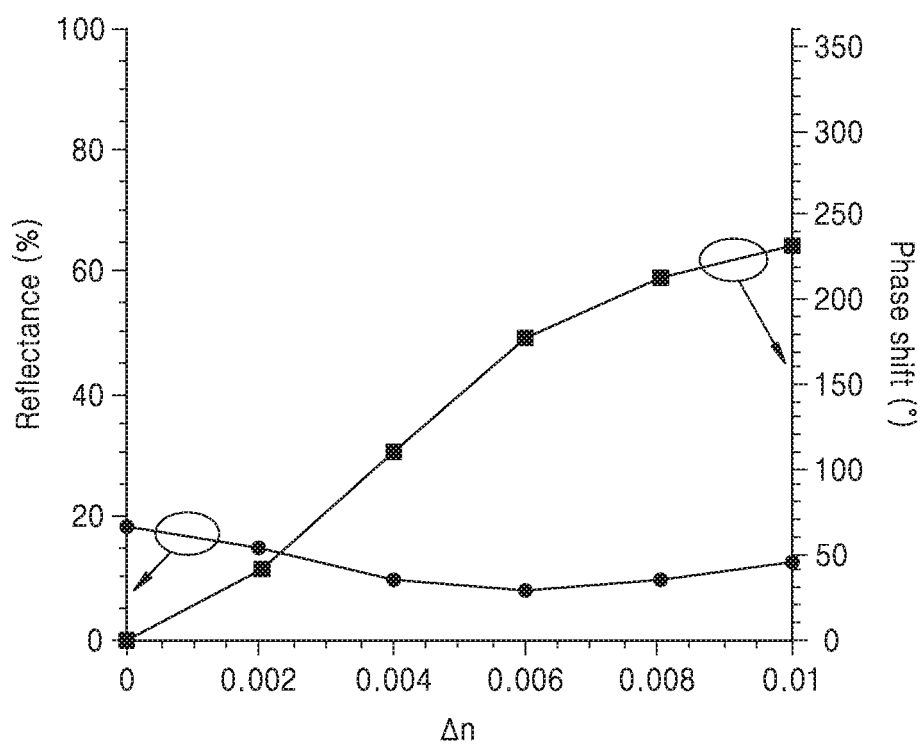
FIG. 7 is a graph showing changes in reflectivity of a light modulation element and the phase shift of incident light according to the change of refractive index of an active layer of FIG. 6.

FIG. 6 is a lateral cross-sectional view showing a light modulation element 1001 according to a comparative example. FIG. 7 is a graph showing changes in reflectivity of the light modulation element 1001 and the phase shift of incident light according to the change of refractive index of an active layer 301 of FIG. 6.

Constituent elements of the light modulation element 1001 may be the same as those of the light modulation element 1000 of FIG. 1 except for a substrate 101 of the light modulation element 1001. Accordingly, in the description of FIG. 6, the contents overlapping with FIG. 1 will be omitted.

Referring to FIG. 6, the light modulation element 1001 may include the substrate 101 and a resonator in which a lower DBR layer 201, the active layer 301, and an upper DBR layer 401 are sequentially stacked in the stated order on the substrate 101. In contrast to the configuration of the substrate 100 described above, the substrate 101 may not include a metal.

The substrate 101 may include a Group III-V semiconductor material. Accordingly, it may be advantageous for epitaxially growing the lower DBR layer 201 on the substrate 101. However, since the substrate 101 does not include a metal, the reflectivity of the light modulation element 1001 may be lower than that of the light modulation element 1000 of FIG. 1. For example, referring to FIG. 7, the reflectivity of the light modulation element 1001 with respect to incident light may be maintained at 20% or less across an entire range of a change in refractive index of the active layer 301 from 0 to 0.01. Thus, although the tendency of the phase shift change also increases over this range, since the reflectivity of the active layer 301 remains low, the optical modulation efficiency of the light modulation element 1001 may be less than that of the light modulation element 1000 of FIG. 1.

Figure 8:
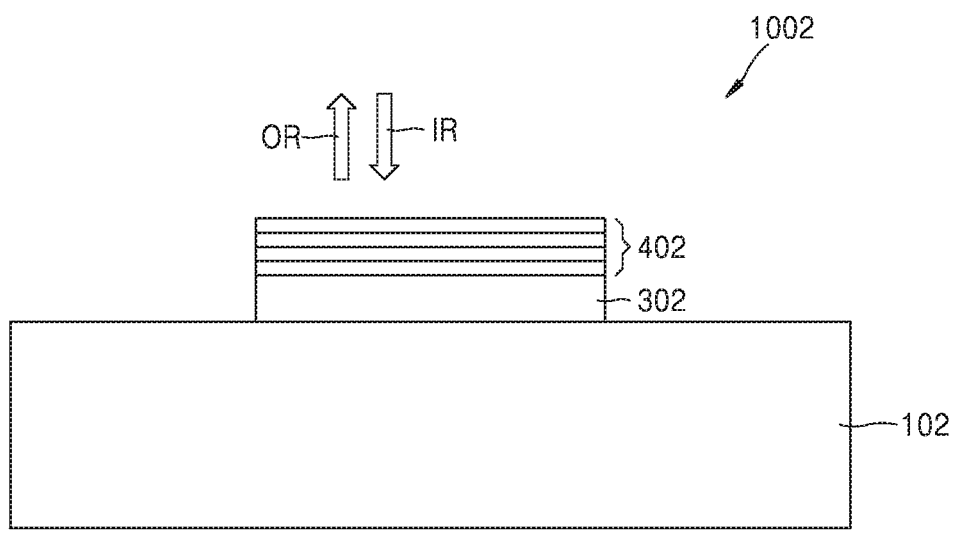
FIG. 8 is a lateral cross-sectional view showing a light modulation element according to another comparative example.
Figure 9:
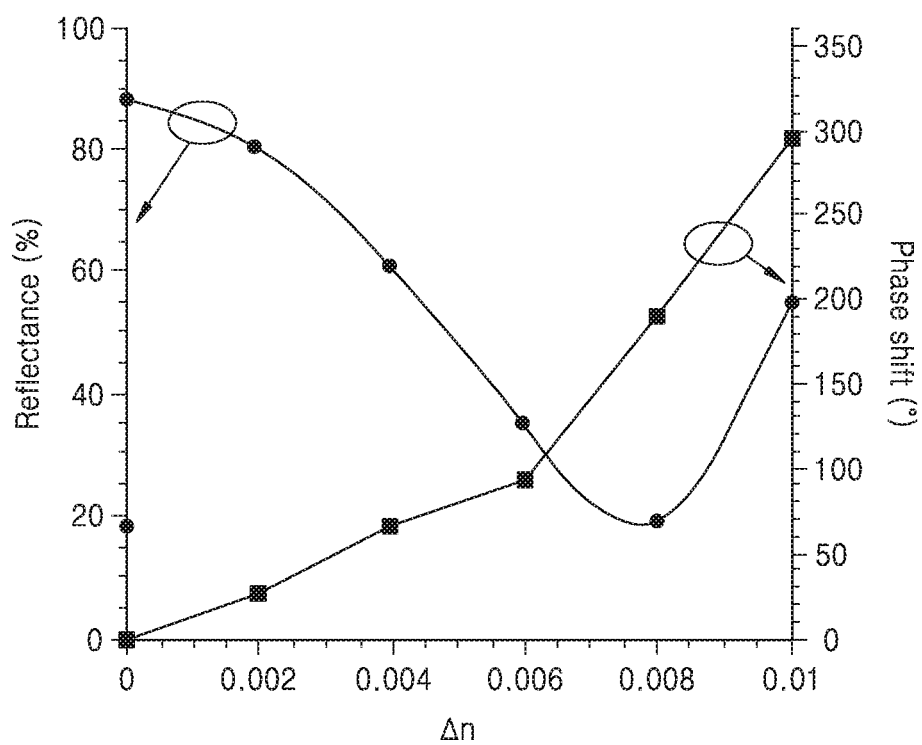
FIG. 9 is a graph showing changes in reflectivity of a light modulation element and the phase shift of incident light according to the change of refractive index of an active layer of FIG. 8.

FIG. 8 is a lateral cross-sectional view showing a light modulation element 1002 according to another comparative example. FIG. 9 is a graph showing changes in reflectivity of the light modulation element 1002 and the phase shift of incident light according to the change of refractive index of an active layer 302 of FIG. 8.

The active layer 302 and an upper DBR layer 402 included in the light modulation element 1002 may be the same as the active layer 300 and the upper DBR layer 400 shown in FIG. 1. Accordingly, in the description of FIG. 8, the contents overlapping with FIG. 1 will be omitted.

Referring to FIG. 8, the light modulation element 1002 may include a substrate 102, an active layer 302 and an upper DBR layer 402 sequentially stacked on the substrate 102. Unlike the light modulation element 1000 of FIG. 1, the light modulation element 1002 does not include a lower DBR layer.

The substrate 102 may include a metal. For example, the substrate 102 may include at least one of gold (Au), aluminum (Al), and silver (Ag), but is not limited thereto. Since the active layer 302 is directly stacked on the substrate 102, the substrate 102 may be part of the resonator. Accordingly, incident light IR may resonate between the upper DBR layer 402 and the substrate 102 instead of between the upper DBR layer 402 and a lower DBR layer.

Referring to FIG. 9, the reflectivity of the light modulation element 1002 may have a greater variance than the reflectivity of the light modulation element 1000 of FIG. 1. For example, the reflectivity of the light modulation element 1002 is within a range of at least about 20% to a maximum of about 90% across the entire range of the change in refractive index from 0 to 0.01. The change in the phase shift also tends to increase across this range, and therefore the optical modulation efficiency of the light modulation element 1002 having reflectivity with such a large variation width may be less than the optical modulation efficiency of the light modulation element 1000 of FIG. 1.

Figure 10:
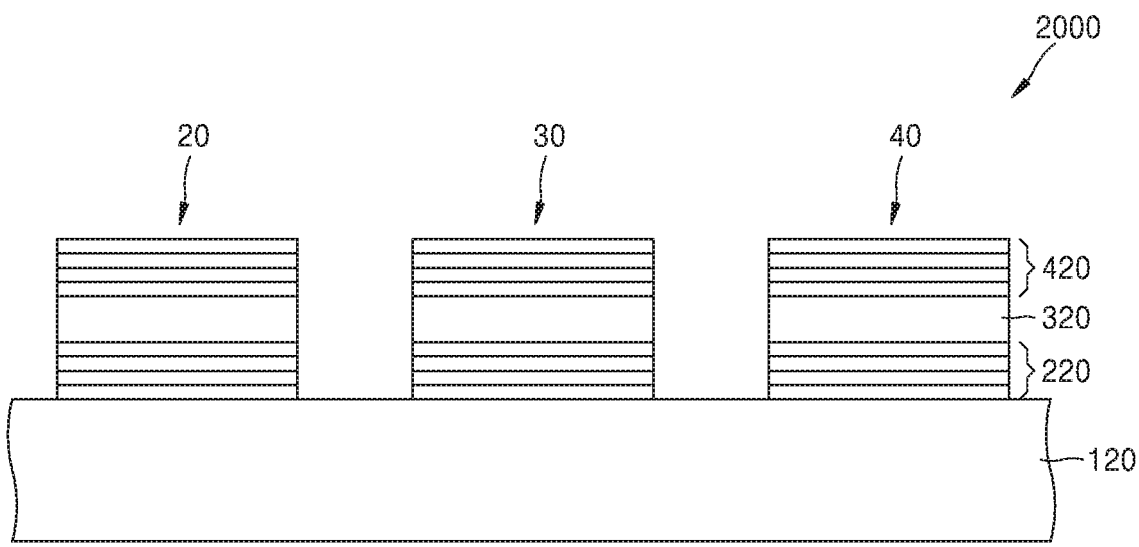
FIG. 10 is a lateral cross-sectional view showing an optical device according to an example embodiment.

FIG. 10 is a lateral cross-sectional view showing an optical device 2000 according to an example embodiment; The lower DBR layer 220, the active layer 320, and the upper DBR layer 420 depicted in FIG. 10 may be the same as the lower DBR layer 200, the active layer 300, and the upper DBR layer 400 of FIG. 1. In the description of FIG. 10, contents overlapping with FIG. 1 will be omitted.

Referring to FIG. 10, the optical device 2000 may include a substrate 120 and a plurality of resonators (for example, a first resonator 20, a second resonator 30, a third resonator 40, etc.) which are spaced apart from each other and have refractive indexes varying according to voltage applied to the substrate 120. Furthermore, the optical device 2000 may further include a voltage controller configured to control a voltage applied to the first resonator 20, the second resonator 30, and the third resonator 40. In FIG. 10, although three resonators 20, 30, and 40 are depicted in FIG. 10, the present example embodiment is not limited thereto, and there may be more or fewer than three resonators.

The substrate 120 may be the same as the substrate 100 of FIG. 1. For example, the substrate 120 may include a metal. The metal may include at least one of gold (Au), aluminum (Al), and silver (Ag), but is not limited thereto. The substrate 120 including a metal may function as a reflective layer reflecting light transmitted through the first through third resonators 20, 30, and 40. Accordingly, the reflectivity of the optical device 2000 with respect to incident light may be increased as compared to a case when the substrate 120 does not include a metal.

A plurality of resonators may be formed on the substrate 120 at regular intervals. For example, a resonator array may be formed by forming the first resonator 20, the second resonator 30, and the third resonator 40 that are spaced apart from each other on the substrate 120. Each of the first through third resonators 20, 30, and 40 may include the lower DBR layer 220 that is provided on the substrate 120, formed by repeatedly alternately stacking two material layers having refractive indexes different from each other. Each of the first through third resonators 20, 30, and 40 may further include the active layer 320 provided on the lower DBR layer 220, including a semiconductor material having a multi-quantum well structure, and having a refractive index that is variable according to an applied voltage, and the upper DBR layer 420 that is provided on the active layer, formed by repeatedly alternately stacking two material layers having refractive indexes different from each other.

The voltage controller may control voltages applied to respective resonators to have different values from each other. Accordingly, the first resonator 20, the second resonator 30, and the third resonator 40 formed on the substrate 120 spaced apart from each other may be controlled to have different refractive indexes. In this way, a phase of light incident on the optical device 2000 may be changed by controlling the refractive indexes of the first through third resonators 20, 30, and 40 included in the resonator array.

The optical device 2000 may be applied to a light detection and ranging (LiDAR), a spatial light modulator (SLM), a micro-display, a holography technique, etc.

Figure 11:
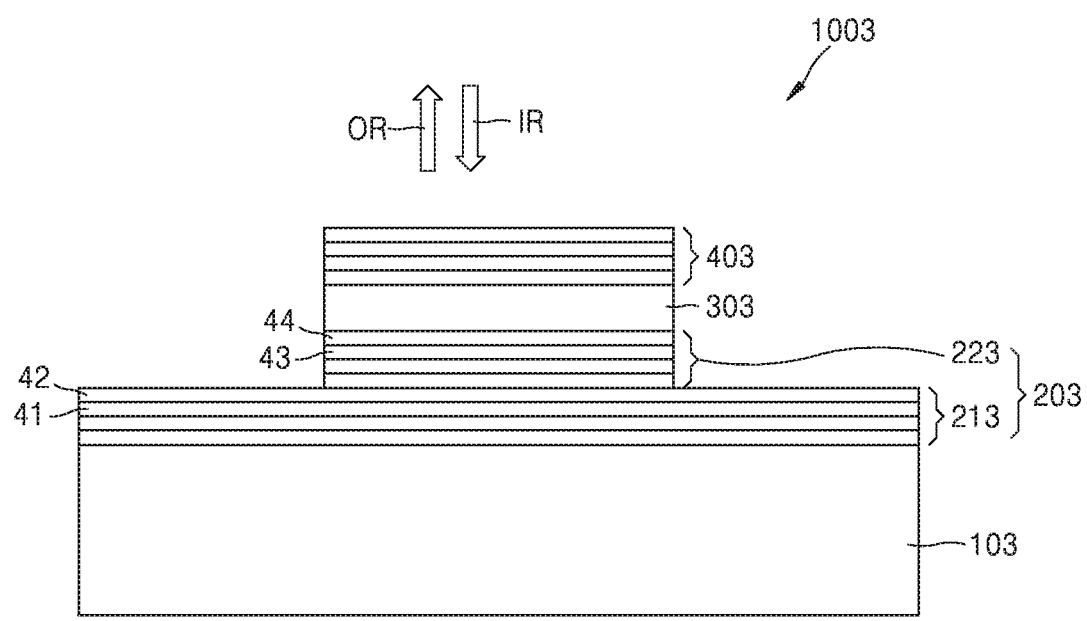
FIG. 11 is a plan view showing a light modulation element according to an example embodiment.
Figure 12:
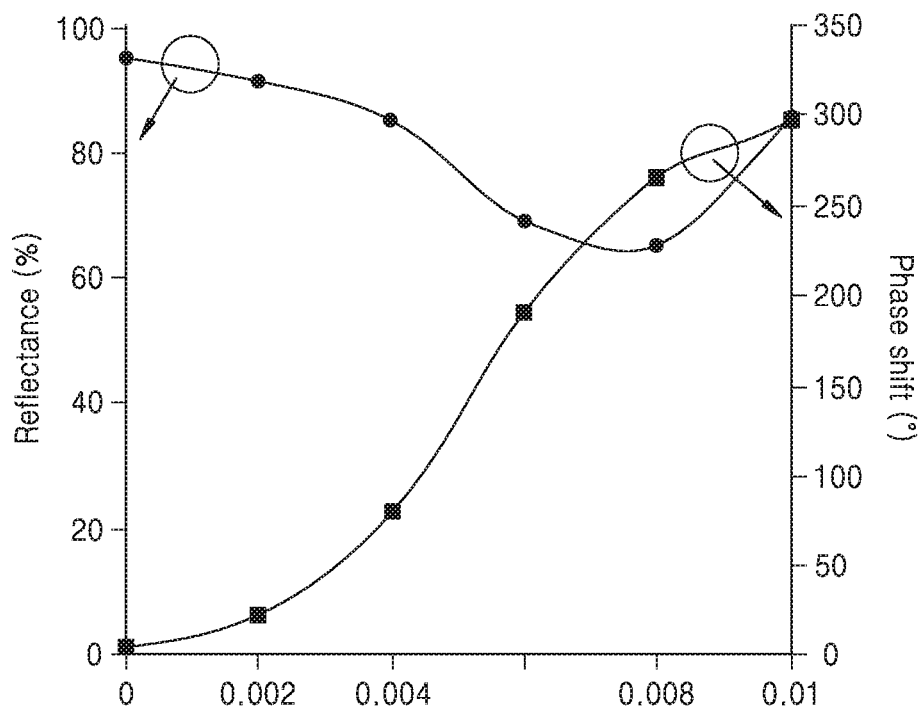
FIG. 12 is a graph showing changes in reflectivity of a light modulation element and a phase shift of incident light according to the change of refractive index of an active layer 303 of FIG. 11.

FIG. 11 is a plan view showing a light modulation element 1003 according to an example embodiment. FIG. 12 is a graph showing changes in reflectivity of a light modulation element 1003 and a phase shift of incident light according to the change of refractive index of an active layer 303 of FIG. 11.

Referring to FIG. 11, the light modulation element 1003 may include a substrate 103, a lower DBR layer 203 that is provided on the substrate 103, formed by repeatedly alternately stacking two material layers having refractive indexes different from each other, an active layer 303 provided on the lower DBR layer 203, including a semiconductor material having a multi-quantum well structure, and having a refractive index that is variable according to an applied voltage, and an upper DBR layer 403 which is provided on the active layer 303, formed by repeatedly alternately stacking two material layers having refractive indexes different from each other. Furthermore, the light modulation element 1003 may further include a first electrode that contacts the lower DBR layer 203 and a second electrode that contacts the upper DBR layer 403.

The lower DBR layer 203 may include a first lower DBR layer 213 provided on the substrate 103, formed by repeatedly alternately stacking two material layers (for example, a first material layer 41 and a second material layer 42) having refractive indexes different from each other, and a second lower DBR layer 223 that is provided on the first lower DBR layer 213, the second lower DBR layer 223 being formed by repeatedly alternately stacking two material layers (for example, a third material layer 43 and a fourth material layer 44) having refractive indexes different from each other, and having a surface area less than that of the first lower DBR layer 213 as shown in FIG. 11. The refractive index of the first material layer 41 may be less than that of the second material layer 42. Alternatively, the refractive index of the second material layer 42 may be less than that of the first material layer 41. The refractive index of the third material layer 43 may be less than that of the fourth material layer 44. Alternatively, the refractive index of the fourth material layer 44 may be less than that of the third material layer 43. The types of materials included in the first material layer 41 and the third material layer 43 may be the same. Also, the types of materials included in the second material layer 42 and the fourth material layer 44 may be the same. In other words, the first material layer 41 and the third material layer 43 may be made of the same material (i.e., a first material) and the second material layer 42 and the fourth material layer 44 may be made of the same material (i.e., a second material). Meanwhile, optical thicknesses of the first material layer 41, the second material layer 42, the third material layer 43, and the fourth material layer 44 may be the same.

The second lower DBR layer 223 and the upper DBR layer 403 form a Fabry-Perot resonator. Incident light IR from the outside of the upper DBR layer 403 may resonate between the second lower DBR layer 223 and the upper DBR layer 403. At this time, the reflectivity of the upper DBR layer 403 may be less than that of the second lower DBR layer 223. Therefore, light resonating between the second lower DBR layer 223 and the upper DBR layer 403 may be outputted to the outside through the upper DBR layer 403.

When a predetermined voltage is applied between the first electrode and the second electrode from an external power source, the refractive index of the active layer 303 provided between the second lower DBR layer 223 and the upper DBR layer 403 may be changed. Accordingly, the phase of light resonating between the second lower DBR layer 223 and the upper DBR layer 403 may be changed. Accordingly, phases of incident light IR and output light OR may be different from each other.

Furthermore, when a predetermined voltage is applied between the first electrode and the second electrode from an external power source, a part of light is absorbed in the active layer 303 by photo-absorption. Accordingly, intensities of the incident light IR and the output light OR may be different from each other.

On the other hand, a surface area of the first lower DBR layer 213 may be greater than that of the second lower DBR layer 223. The first lower DBR layer 213 may function as a reflective layer that reflects light transmitted through the resonator formed by the second lower DBR layer 223 and the upper DBR layer 403. Accordingly, the reflectivity of the light modulation element 1003 with respect to the incident light IR may be increased as compared with the case when the first lower DBR layer 213 is not provided. For example, while the refractive index of the active layer 303 varies (i.e., across a range of variance of the refractive index of the active layer 303), the reflectivity of the light modulation element 1003 with respect to the incident light IR may be maintained at 60% or more.

The substrate 103 may be provided under the first lower DBR layer 213. The substrate 103 may include a Group III-V semiconductor material. The Group III-V semiconductor material may have a single crystal structure. Accordingly, it may be advantageous for epitaxially growing the first lower DBR layer 213 on the substrate 103.

The first lower DBR layer 213, the second lower DBR layer 223, and the upper DBR layer 403 may function as reflective layers having a predetermined reflectivity and may include a pair of material layers having different refractive indexes. For example, the first lower DBR layer 213, the second lower DBR layer 223, and the upper DBR layer 403 may include a structure in which a material layer having a relatively low refractive index and a material layer having a relatively high refractive index are repeatedly alternately stacked. For example, the first lower DBR layer 213, the second lower DBR layer 223, and the upper DBR layer 403 may include an $AlAs/Al_{0.5}Ga_{0.5}As$ structure or an $Al_{0.9}Ga_{0.1}As/Al_{0.3}Ga_{0.7}As$ structure repeatedly alternately stacked. However, the present example embodiment is not limited thereto, and a ratio of Al to Ga may vary in either or both of the relatively low refractive index layer and the relatively high refractive index layer. Also, the material layers of the first lower DBR layer 213, the second lower DBR layer 223, and the upper DBR layer 403 may include materials completely different from the materials described above. An optical thickness (a value obtained by multiplying a physical thickness by a refractive index of the material layer) of each of the material layers of the first lower DBR layer 213, the second lower DBR layer 223, and the upper DBR layer 403 may be an odd multiple of $\lambda/4$ ($\lambda$ is a wavelength of incident light). A reflectivity of the first lower DBR layer 213, the second lower DBR layer 223, and the upper DBR layer 403 may increase with an increase in the number of pairs of the two material layers that are present in the DBR layer. The second lower DBR layer 223 may have a reflectivity greater than that of the upper DBR layer 403. Accordingly, light resonating between the second lower DBR layer 223 and the upper DBR layer 403 may be output to the outside through the upper DBR layer 403.

The active layer 303 may be the same as the active layer 300 described with reference to FIGS. 1, 4, and 5. Accordingly, the description about the active layer 303 is omitted.

Referring to FIG. 12, as the refractive index of the active layer 303 (shown as the horizontal axis) increases by application of a voltage from the outside, the phase shift of the incident light IR also increases. On the other hand, even when a refractive index of the active layer 303 is changed, a range of the reflectivity of the light modulation element 1003 with respect to the incident light IR is not relatively large. For example, across a refractive index range from 0 to 0.01, the reflectivity of the light modulation element 1003 may be in a range of at least about 60% to a maximum of about 99%. As described above, as the refractive index of the active layer 303 increases, the light modulation element 1003 having a reflectivity with a relatively small variation and a phase shift showing a relatively rapid change may perform efficient optical modulation.

Figure 13:
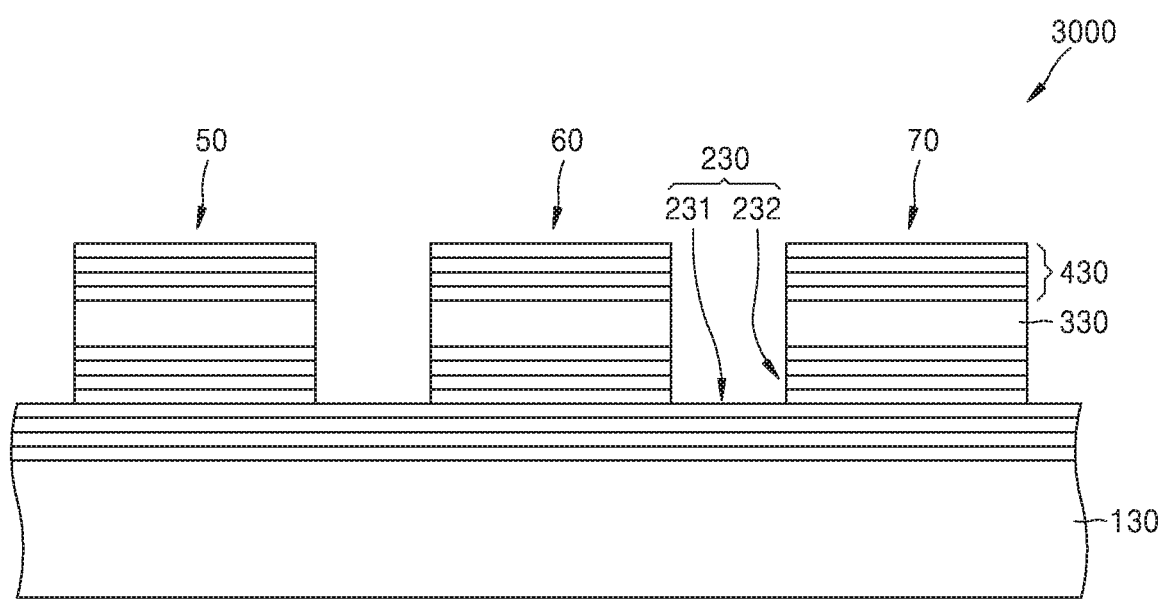
FIG. 13 is a lateral cross-sectional view showing an optical device according to an example embodiment.

FIG. 13 is a lateral cross-sectional view showing an optical device 3000 according to an example embodiment. A first lower DBR layer 231, a second lower DBR layer 232, an active layer 330, and an upper DBR layer 430 depicted in FIG. 13 may respectively be the same as the first lower DBR layer 213, the second lower DBR layer 223, the active layer 303, and the upper DBR layer 403 depicted in FIG. 11. In the description of FIG. 13, the contents overlapping with FIG. 11 will be omitted.

Referring to FIG. 13, the optical device 3000 includes a substrate 130, a first lower DBR layer 231 that is provided on the substrate 130, formed by repeatedly alternately stacking two material layers having refractive indexes different from each other, and a plurality of resonators (for example, a first resonator 50, a second resonator 60, and a third resonator 70) spaced from each other on the first lower DBR layer 231 and each having a refractive index varying according to an applied voltage. Furthermore, the optical device 3000 may further include a voltage controller configured to independently control a voltage applied to the first resonator 50, the second resonator 60, and the third resonator 70. In FIG. 13, first through third resonators 50, 60, and 70 are shown, but the present example embodiment is not limited thereto, and the number of resonators may be more than three.

The substrate 130 may be the same as the substrate 103 of FIG. 11. For example, the substrate 103 may include a Group III-V semiconductor material. The group III-V semiconductor material may have a single crystal structure. Accordingly, it may be advantageous for epitaxially growing the first lower DBR layer 231 on the substrate 130.

The first through third resonators 50, 60, and 70 may be formed on the substrate 130 at regular intervals. For example, a resonator array may be formed by forming the first resonator 50, the second resonator 60, and the third resonator 70 that are spaced apart from each other on the substrate 130. Each of the first through third resonators 50, 60, and 70 may include: the second lower DBR layer 232 that is provided on the first lower DBR layer 231, formed by repeatedly alternately stacking two material layers having refractive indexes different from each other, and having a surface area less than that of the first lower DBR layer 231. Each DBR layer may further include the active layer 330 that is provided on the lower DBR layer 232 including a semiconductor material having a multi-quantum well structure, and having a refractive index that varies according to an applied voltage; and the upper DBR layer 430 that is provided on the active layer 330, formed by repeatedly alternately stacking two material layers having refractive indexes different from each other.

The voltage controller may control voltages applied to the first through third resonators 50, 60, and 70 different from each other. Accordingly, the first resonator 50, the second resonator 60, and the third resonator 70 formed on the substrate 130, which are spaced apart from each other, may be controlled to have different refractive indexes from each other. Thus, by controlling the refractive indexes of the first through third resonators 50, 60, and 70 included in the resonator array, the phase of the light incident on the optical device 3000 may be changed.

The optical device 3000 may be applied to a LiDAR, an SLM, a micro-display, a holography technique, etc.

FIGS. 14 through 17 sequentially show a method of manufacturing the optical device 2000 of FIG. 10.

Figure 14:
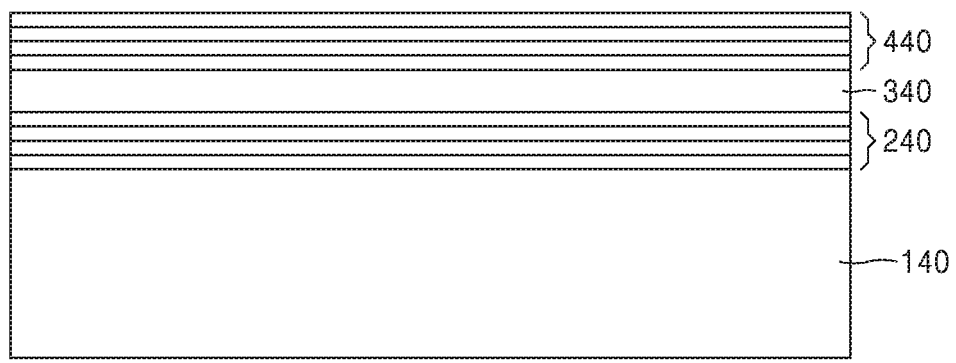
FIG. 14 is a cross-sectional view for explaining part of a method of manufacturing the optical device of FIG. 10.

Referring to FIG. 14, a first DBR layer 240, an active layer 340, and a second DBR layer 440 may be sequentially stacked on a substrate 140. The first DBR layer 240 and the second DBR layer 440 may be formed by repeatedly alternately stacking material layers having different refractive indexes. A material that may be included in the material layer is the same as the material described with reference to FIG. 1. The active layer 340 may include a semiconductor material including a multi-quantum well structure. A material that may be included in the active layer 340 is the same as the material described with reference to FIG. 1.

Figure 15:
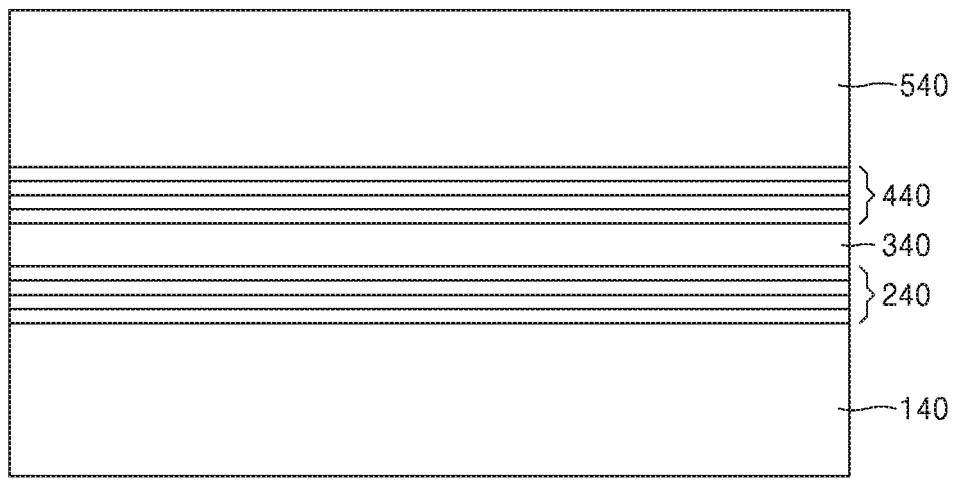
FIG. 15 is a cross-sectional view for explaining part of a method of manufacturing the optical device of FIG. 10.

Referring to FIG. 15, a metal layer 540 may be formed on the second DBR layer 440.

Figure 16:
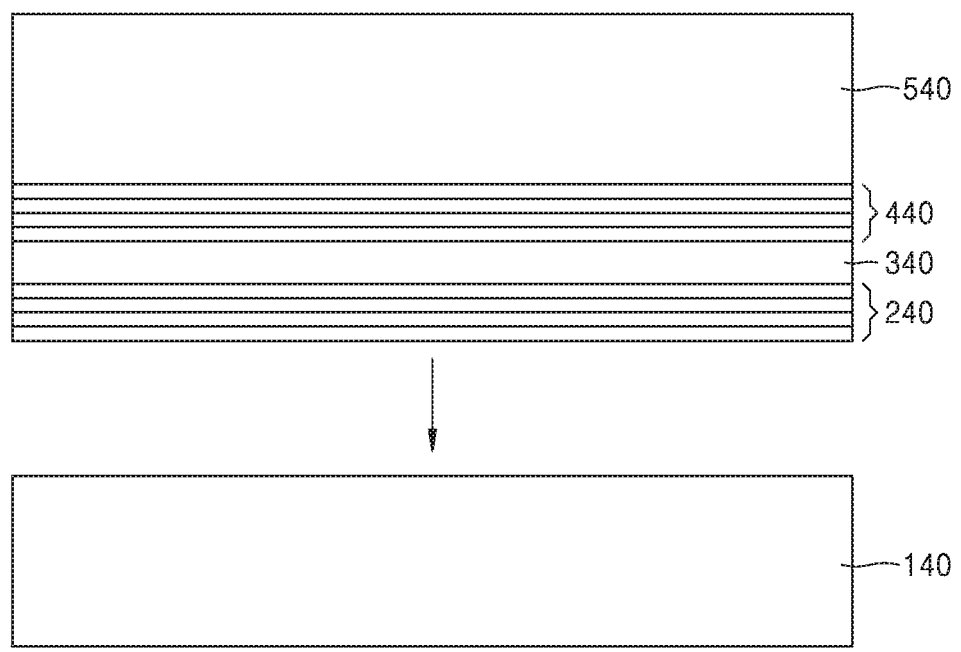
FIG. 16 is a cross-sectional view for explaining part of a method of manufacturing the optical device of FIG. 10.

Referring to FIG. 16, the substrate 140 may be removed from the first DBR layer 240.

Figure 17:
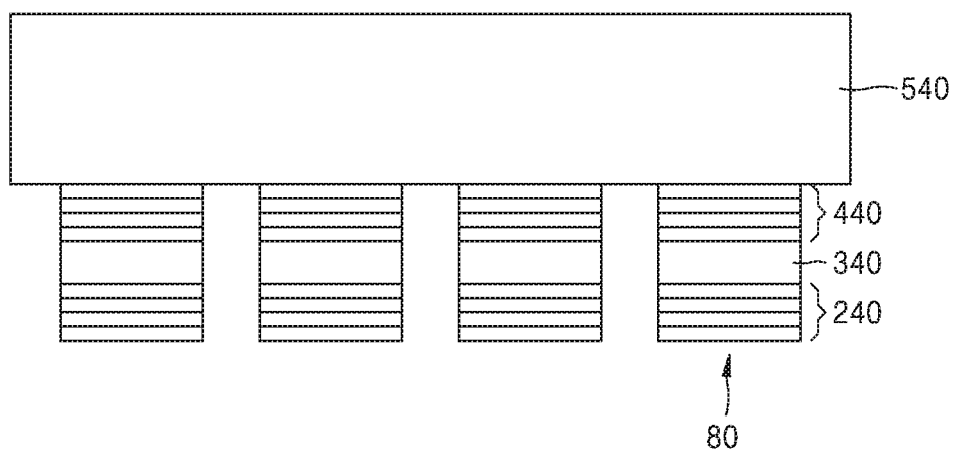
FIG. 17 is a cross-sectional view for explaining part of a method of manufacturing the optical device of FIG. 10.

Referring to FIG. 17, a plurality of resonators 80 may be formed by patterning the first DBR layer 240, the active layer 340, and the second DBR layer 440.

The structure formed through the series of manufacturing processes shown in FIGS. 14 through 17 may be the same structure as the optical device 2000 of FIG. 10. In this case, the metal layer 540 may be a structure corresponding to the substrate 120 of FIG. 10, the second DBR layers 440 may correspond to the lower DBR layers 220, and the first DBR layers 240 may correspond to the upper DBR layers 420.

Figure 18:
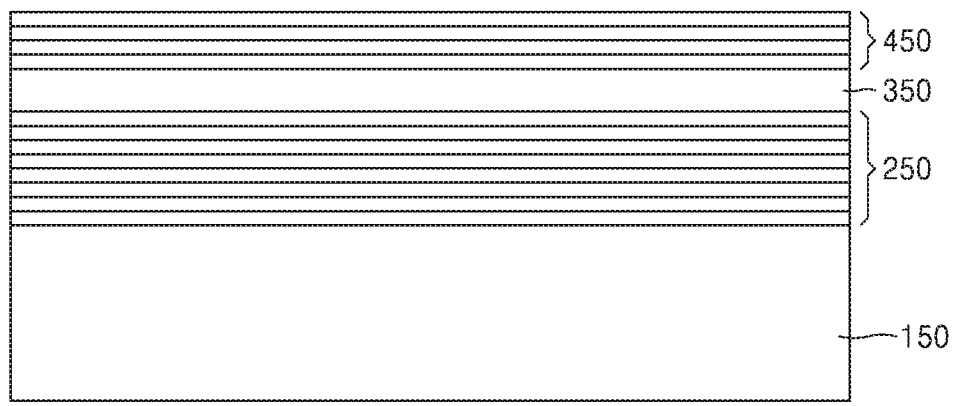
FIG. 18 is a cross-sectional view for explaining part of a method of manufacturing the optical device of FIG. 13.
Figure 19:
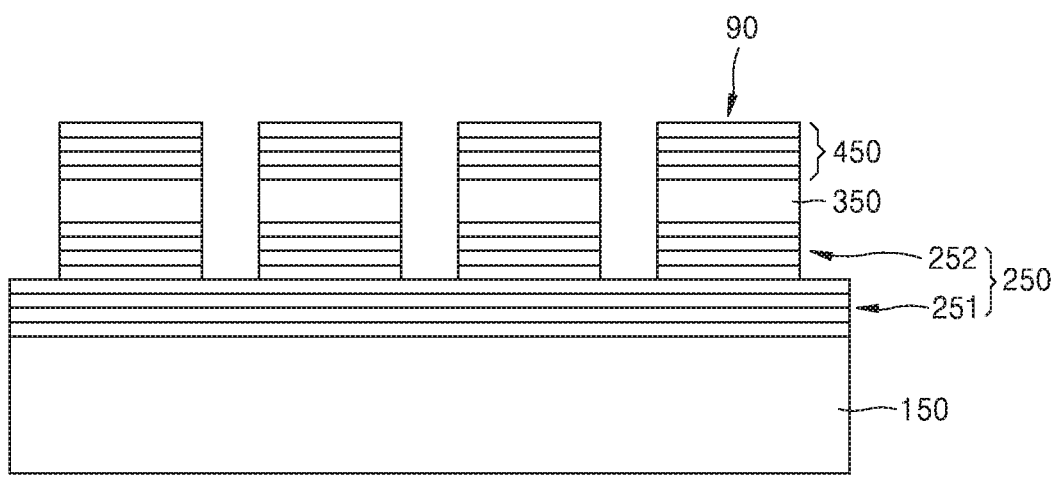
FIG. 19 is a cross-sectional view for explaining part of a method of manufacturing the optical device of FIG. 10.

FIGS. 18 and 19 sequentially show a method of manufacturing the optical device 3000 of FIG. 13.

Referring to FIG. 18, a third DBR layer 250, an active layer 350, and a fourth DBR layer 450 may be sequentially stacked on a substrate 150. The third DBR layer 250 and the fourth DBR layer 450 may be formed by repeatedly alternately stacking material layers having different refractive indexes. The third DBR layer 250 may have a thickness greater than that of the fourth DBR layer 450. A material that may be included in the material layer is the same as the material described with reference to FIG. 1. The active layer 350 may include a semiconductor material including a multi-quantum well structure. A material that may be included in the active layer 350 is the same as the material described with reference to FIG. 1.

Referring to FIG. 19, a plurality of resonators 90 may be formed by patterning the third DBR layer 250, the active layer 350, and the fourth DBR layer 450. For example, the third DBR layer 250, the active layer 350, and the fourth DBR layer 450 may be etched, and thus, may be patterned. In this case, a lower third DBR layer 251 and an upper third DBR layer 252 may be formed by etching only a part of the third DBR layer 250 in the depth direction as shown in FIG. 19. A surface area of the lower third DBR layer 251 may be greater than that of the upper third DBR layer 252. Accordingly, the resonator 90 may include the upper third DBR layer 252, the active layer 350, and the upper DBR layer 450.

The structure formed through the series of manufacturing processes shown in FIGS. 18 and 19 may be the same structure as the optical device 3000 of FIG. 13.

Figure 20:
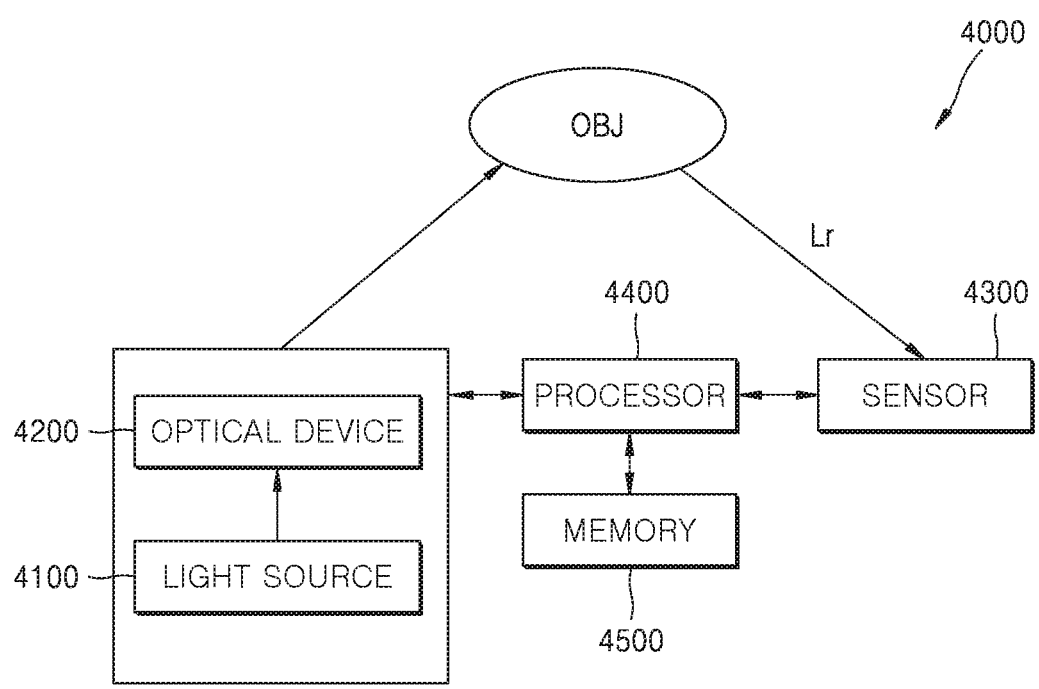
FIG. 20 is a block diagram showing a schematic configuration of an electronic device according to an example embodiment.

FIG. 20 is a block diagram showing a schematic configuration of an electronic device 4000 according to an example embodiment.

Referring to FIG. 20, the electronic device 4000 may include a light source 4100, an optical device 4200 configured to control a traveling direction of light incident from the light source 4100 to be directed toward an object OBJ, a sensor 4300 configured to receive light, and a processor 4400 configured to analyze light received by the sensor 4300. Also, the electronic device 4000 may further include a memory 4500 in which codes or data for the execution of the processor 4400 are stored.

The light source 4100 may include an LED or a laser diode emitting laser light. The light source 4100 may include a vertical cavity surface emitting laser (VCSEL). Also, the light source 4100 may include a distributed feedback laser (DFB). The light source 4100 may include, for example, an active layer including a Group III-V semiconductor material or a Group II-VI semiconductor material and having a multi-quantum well structure, but the present example embodiment is not limited thereto. The light source 4100 may emit laser light having a wavelength of approximately 850 nm or 940 nm, or may emit light in a near-infrared or visible light wavelength band. A wavelength of light emitted from the light source 4100 is not particularly limited, and the light source 4100 that emits light in any desired wavelength band may be used.

The optical device 4200 may employ any one of the optical devices 2000 and 3000, a combination thereof, and a modified form of the optical devices 2000 and 3000.

The sensor 4300 senses light Lr reflected by the object OBJ. The sensor 4300 may include an array of light detecting elements. The sensor 4300 may further include a spectroscopic element for analyzing light reflected from the object OBJ by wavelength.

The processor 4400 may perform a computation for acquiring information about the object OBJ from the light received by the sensor 4300. Processor 4400 may obtain and process information about the object OBJ, for example, two-dimensional or three-dimensional image information. Also, the processor 4400 may also be responsible for overall processing and control of the electronic device 4000. Besides the description above, the processor 4400 may control an overall operation of the light source 4100, the sensor 4300, etc. Also, the processor 4400 may control the driving of a voltage controller included in the optical device 4200. The processor 4400 may also determine a user authentication etc. based on information obtained from the object OBJ or may execute other applications.

Information as a result of the calculation in the processor 4400, that is, information about a shape and position of the object OBJ, may be transmitted to other devices or units as required. For example, information about the object OBJ may be transmitted to a control unit of another electronic device that uses information about the object OBJ. Other units to which the result is transmitted may be a display device or a printer that outputs the result. Besides the description above, other units may include a smart phone, a mobile phone, a personal digital assistant (PDA), a laptop, a PC, various wearable devices, and other mobile or non-mobile computing devices, but the present example embodiment is not limited thereto.

The memory 4500 may store a code for execution in the processor 4400. Besides the code, various execution modules to be executed in the electronic device 4000 and data therefor may be stored in the memory 4500. For example, a program code used in a computation, performed by the processor 4400, for acquiring information about the object OBJ may be stored in the memory 4500. In addition, a code of an application module etc. that may be executed by using the information of the object OBJ may be stored in the memory 4500. Also, a communication module, a camera module, a motion picture reproducing module, an audio reproducing module, etc. may further be stored as a program for driving a device that may be additionally provided in the electronic device 4000 in the memory 4500.

The memory 4500 may include at least one of a flash memory type, a hard disk type, a multimedia card micro type, a card type memory (e.g., SD or XD memory), a RAM (Random Access Memory), a SRAM (Static Random Access Memory), a ROM (Read Only Memory), an EEPROM (Electrically Erasable Programmable Read-Only Memory), a PROM, a magnetic memory, a magnetic disc, and an optical disk.

The electronic device 4000 may be included in, for example, a portable mobile communication device, a smart phone, a smart watch, a personal digital assistant (PDA), a laptop, a PC, and other mobile or non-mobile devices, but is not limited thereto. Also, the electronic device 4000 may be included in an autonomous drive device, such as an unmanned vehicle, an autonomous vehicle, a robot, a drone, etc. or an Internet of Things (IoT) device.

The specific implementations described in example embodiments are illustrative and do not in any way limit the scope of the disclosure. For brevity of description, descriptions of electronic configurations, control systems, software, and other functional aspects of such systems of the related art are omitted. Also, the connections or connecting members of lines between constituent elements shown in the drawings indicate functional connections and/or physical or circuit connections, which may be replaced or additionally provided as a variety of functional connections, physical connections, or circuit connections in actual devices.

Various example embodiments according to the present disclosure may provide a light modulation element having increased reflectivity by further including a reflective layer below the Fabry-Perot resonator including a DBR and a semiconductor material.

Various example embodiments according to the present disclosure may provide an optical device and an electronic device including a light modulation element having improved light modulation efficiency due to increased reflectivity.

While the example embodiments have been described in detail with reference to the accompanying drawings to facilitate understanding of the disclosure, it should be understood that example embodiments described herein should be considered in a descriptive sense only and not for purposes of limitation. Also, it should be understood that the disclosure is not limited to the example embodiments described above. This is because various changes in form and details may be made by those of ordinary skill in the art.

What is claimed is:

1. A light modulation element comprising:
a substrate;
a first lower distributed Bragg reflector (DBR) layer provided on the substrate, wherein the first lower DBR layer comprises at least one first material layer and at least one second material layer alternately stacked with the at least one first material layer, a first refractive index of the at least one first material layer is different from a second refractive index of the at least one second material layer;
a second lower DBR layer provided on the first lower DBR layer, wherein the second lower DBR layer comprises at least one third material layer and at least one fourth material layer alternately stacked with the at least one third material layer, and a third refractive index of the at least one third material layer is different from a fourth refractive index of the at least one fourth material layer, the second lower DBR layer having a surface area less than a surface area of the first lower DBR layer;
an active layer provided on the second lower DBR layer, the active layer comprising a semiconductor material having a multi-quantum well structure and having a refractive index that is variable according to an applied voltage; and
an upper DBR layer provided on the active layer, wherein the upper DBR layer comprises at least one fifth material layer and at least one sixth material layer alternately stacked with the at least one fifth material layer, and a fifth refractive index of the at least one fifth material layer is different from a sixth refractive index of the at least one sixth material layer.

2. The light modulation element of claim 1, wherein a range of a variance of the refractive index of the active layer is set such that a reflectivity of the light modulation element with respect to an incident light thereon is maintained at 60% or more.

3. The light modulation element of claim 1, wherein an optical thickness of a material layer from among the at least one first material layer and the at least one second material layer is equal to an optical thickness of a material layer from among the at least one third material layer and the at least one fourth material layer.

4. The light modulation element of claim 1, wherein the second refractive index of the at least one second material layer is less than the first refractive index of the at least one first material layer,
the fourth refractive index of the at least one fourth material layer is less than the third refractive index of the at least one third material layer,
the at least one first material layer and the at least one third material layer comprise a same first material, and
the at least one second material layer and the at least one fourth material layer comprise a same second material.

5. The light modulation element of claim 1, wherein the active layer comprises a pair of $GaAs_xP_{1-x}$ (0<x<1) lead barrier layers.

6. The light modulation element of claim 5, further comprising:
at least one GaAs sub-barrier layer alternately stacked with at least one $In_yGa_{1-y}As$ (0<y<1) well layer between the pair of $GaAs_xP_{1-x}$ lead barrier layers.

7. The light modulation element of claim 1, further comprising:
a first electrode contacting the second lower DBR layer; and
a second electrode contacting the upper DBR layer.

8. A light modulation element comprising:
a substrate comprising a metal;
a lower DBR layer provided on the substrate, wherein the lower DBR layer comprises at least one first material layer and at least one second material layer alternately stacked with the at least one first material layer, and a first refractive index of the at least one first material layer is different from a second refractive index of the at least one second material layer;
an active layer provided on the lower DBR layer, the active layer comprising a semiconductor material having a multi-quantum well structure and having a refractive index that is variable according to an applied voltage; and
an upper DBR layer provided on the active layer, wherein the upper DBR layer comprises at least one third material layer and at least one fourth material layer alternately stacked with the at least one third material layer, and a third refractive index of the at least one third material layer is different from a fourth refractive index of the at least one fourth material layer.

9. The light modulation element of claim 8, wherein the metal comprises at least one from among Au, Al, and Ag.

10. The light modulation element of claim 8, wherein a range of a variance of the refractive index of the active layer is set such that a reflectivity of the light modulation element with respect to an incident light thereon is maintained at 60% or more.

11. An optical device comprising:
a substrate;
a first lower DBR layer provided on the substrate, wherein the first lower DBR layer comprises at least one first material layer and at least one second material layer alternately stacked with the at least one first material layer, wherein a first refractive index of the at least one first material layer is different from a second refractive index of the at least one second material layer;
a plurality of resonators spaced apart from each other and provided on the first lower DBR layer, each resonator from among the plurality of resonators having a refractive index that is variable according to an applied voltage; and
a voltage controller configured to control the voltage applied to each resonator from among the plurality of resonators, wherein
each resonator from among the plurality of resonators comprises:
a second lower DBR layer provided on the first lower DBR layer, wherein the second lower DBR layer comprises at least one third material layer and at least one fourth material layer alternately stacked with the at least one third material layer, and a third refractive index of the at least one third material layer is different from a fourth refractive index of the at least one fourth material layer, the second lower DBR layer having a surface area less than a surface area of the first lower DBR layer;
an active layer provided on the second lower DBR layer, the active layer comprising a semiconductor material having a multi-quantum well structure and having a refractive index that is variable according to the applied voltage; and
an upper DBR layer provided on the active layer, wherein the upper DBR layer comprises at least one fifth material layer and at least one sixth material layer alternately stacked with the at least one fifth material layer, and a fifth refractive index of the at least one fifth material layer is different from a sixth refractive index of the at least one sixth material layer.

12. The optical device of claim 11, wherein a range of a variance of the refractive index of the active layer is set such that a reflectivity of the optical device with respect to an incident light thereon is maintained at 60% or more.

13. The optical device of claim 11, wherein an optical thickness of a material layer from among the at least one first material layer and the at least one second material layer is equal to an optical thickness of a material layer from among the at least one third material layer and the at least one fourth material layer.

14. The optical device of claim 11, wherein the second refractive index of the at least one second material layer is less than the first refractive index of the at least one first material layer,
the fourth refractive index of the at least one fourth material layer is less than the third refractive index of the at least one third material layer,
the at least one first material layer and the at least one third material layer comprise a same first material, and
the at least one second material layer and the at least one fourth material layer comprise a same second material.

15. The optical device of claim 11, wherein the active layer comprises a pair of $GaAs_xP_{1-x}$ ($0<x<1$) lead barrier layers.

16. The optical device of claim 15, further comprising:
at least one GaAs sub-barrier layer alternately stacked with at least one $In_yGa_{1-y}As$ ($0<y<1$) well layer between the pair of $GaAs_xP_{1-x}$ lead barrier layers.

17. An optical device comprising:
a substrate comprising a metal;
a plurality of resonators spaced apart from each other and provided on the substrate, each resonator from among the plurality of resonators having a refractive index that is variable according to an applied voltage; and
a voltage controller configured to control the voltage applied to each resonator from among the plurality of resonators, wherein
each resonator from among the plurality of resonators comprises:
a lower DBR layer provided on the substrate, wherein the lower DBR layer comprises at least one first material layer and at least one second material layer alternately stacked with the at least one first material layer, and a first refractive index of the at least one first material layer is different from a second refractive index of the at least one second material layer;
an active layer provided on the lower DBR layer, the active layer comprising a semiconductor material having a multi-quantum well structure and having a refractive index that is variable according to the applied voltage; and
an upper DBR layer provided on the active layer, wherein the upper DBR layer comprises at least one third material layer and at least one fourth material layer alternately stacked with the at least one third material layer, and a third refractive index of the at least one third material layer is different from a fourth refractive index of the at least one fourth material layer.

18. An electronic device comprising:
a light source;
the optical device of claim 11, wherein the optical device controls a direction of light received from the light source to be transmitted towards an object;
a sensor configured to receive light reflected from the object; and a processor configured to analyze the light received by the sensor.

19. The electronic device of claim 18, wherein an optical thickness of a material layer from among the at least one first material layer and the at least one second material layer is equal to an optical thickness of a material layer from among the at least one third material layer and the at least one fourth material layer.

20. The electronic device of claim 18, wherein the second refractive index of the at least one second material layer is less than the first refractive index of the at least one first material layer,
    the fourth refractive index of the at least one fourth material layer is less than the third refractive index of the at least one third material layer,
    the at least one first material layer and the at least one third material layer comprise a same first material, and
    the at least one second material layer and the at least one fourth material layer comprise a same second material.

* * * * *